United States Patent
La Fontaine et al.

(10) Patent No.: US 6,710,853 B1
(45) Date of Patent: Mar. 23, 2004

(54) PHASE GRATING FOCUS MONITOR USING OVERLAY TECHNIQUE

(75) Inventors: Bruno La Fontaine, Pleasanton, CA (US); Jongwook Kye, Pleasanton, CA (US); Harry Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 246 days.

(21) Appl. No.: 09/944,795

(22) Filed: Aug. 31, 2001

(51) Int. Cl.[7] .................... G03B 27/52; G03B 27/42; G01B 11/00
(52) U.S. Cl. .................... 355/55; 355/53; 356/400; 356/401
(58) Field of Search .................... 355/55, 53, 67, 355/71; 716/19; 430/5, 30; 356/123, 399, 400, 401; 433/22; 250/548

(56) References Cited

U.S. PATENT DOCUMENTS 5,300,786 A  *  4/1994  Brunner et al. ............. 250/548
5,756,238 A  *  5/1998  Barr et al. .................. 430/5

OTHER PUBLICATIONS

New Phase Shift Gratings for Measuring Aberrations, by Hiroshi Nomura, published by SPIE, dated Feb. 27, 2001 (11 pages).

* cited by examiner

Primary Examiner—Russell Adams
Assistant Examiner—Peter B. Kim (57) ABSTRACT

An optical tool includes a tool body that is transparent to light. Pluralities of parallel opaque lines on the body form a first outline in the shape of the square, and a second outline in the shape of a square which is centrally located relative to and within the first-mentioned square. Each pair of adjacent parallel lines has therebetween a first region that allows transmission of light therethrough without changing phase thereof, and a second region alongside the first region that allows transmission of light therethrough while shifting the phase thereof by 90°. The phase shifting and non-phase shifting regions are positioned so that the images of the outlines provided by a lens on an object shit in position a substantial amount as the distance between the lens and the object is changed.

15 Claims, 7 Drawing Sheets

PHASE GRATING FOCUS MONITOR USING OVERLAY TECHNIQUE

BACKGROUND OF THE INVENTION

1. Field of the Invention

This invention relates generally to optical apparatus in semiconductor technology, and more particularly, to a test monitor for use in focusing an image on a semiconductor wafer.

2. Discussion of the Related Art

Typically, an optical system 30 (FIG. 1) used for patterning photoresist 32 on a semiconductor wafer 34 comprises a light source 36, a mask or reticle 38 having opaque lines 40 and transparent portions 42, and a lens 44, the light from the light source 36 passing through the transparent portions 42 of the mask/reticle 38 through the lens 44 and to the photoresist 32, with light being blocked from reaching the lens 44 (and photoresist 32) by the opaque lines 40 of the 38 mask/reticle.

Figure 1:
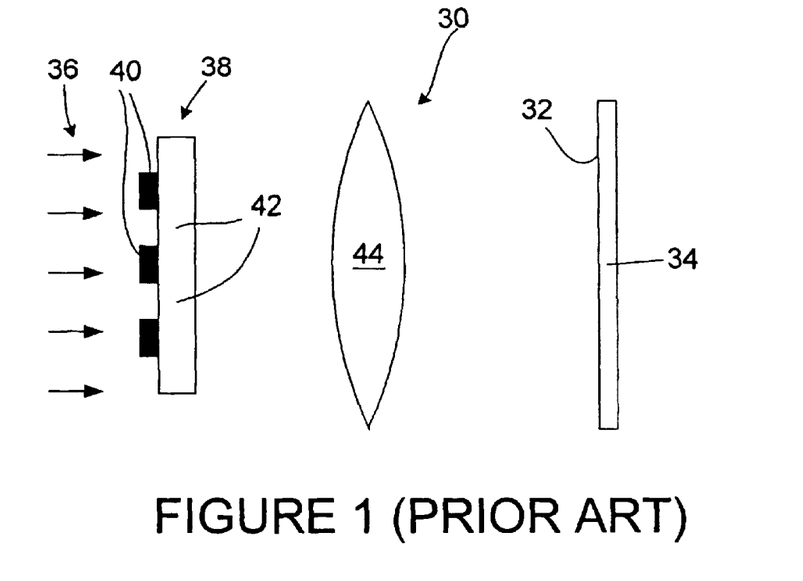
FIG. 1 is an elevational view of a typical optical system used for patterning photoresist of a semiconductor wafer.

As is well known, there is a need to position the wafer 34 at a proper distance with respect to the lens 44 so that fall on the photoresist 32 of the wafer 34 will be in the plane of best focus.

Figure 2:
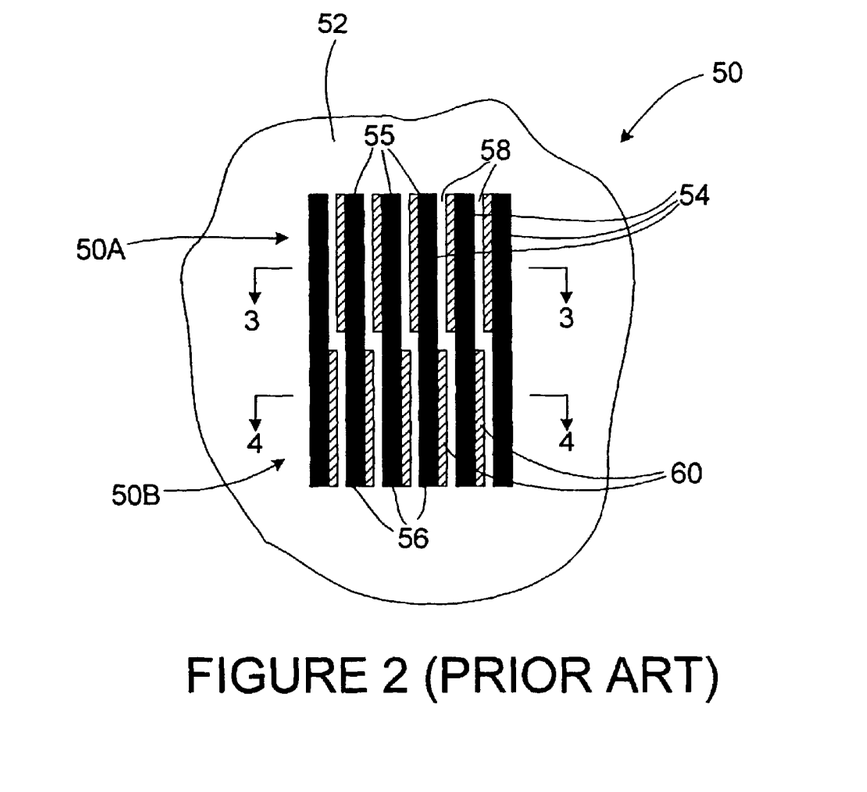
FIG. 2 is a plan view of a test focus monitor of the prior art.
Figure 3:
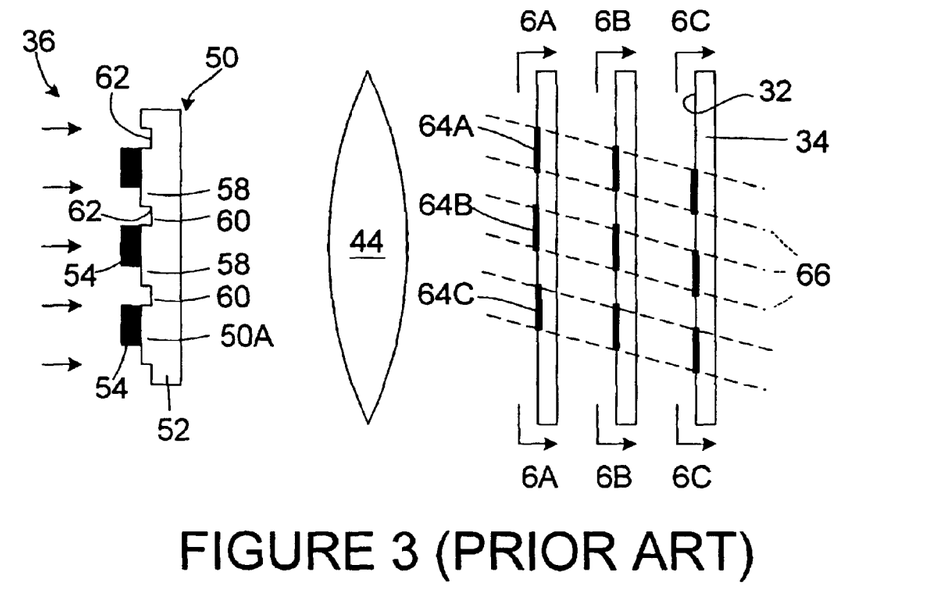
FIG. 3 is an elevational view of an optical system illustrating the use of the test focus monitor of FIG. 2.
Figure 4:
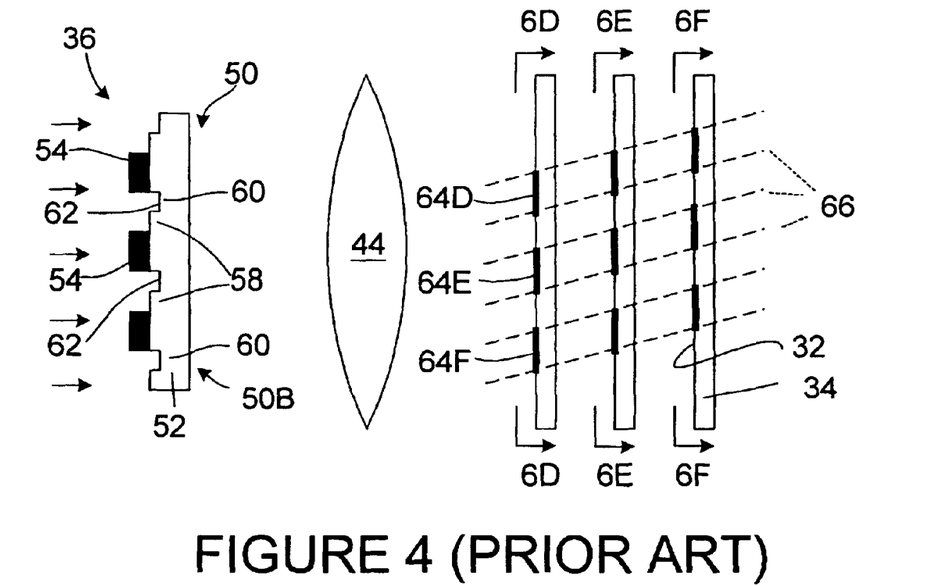
FIG. 4 is an elevational view similar to that shown in FIG. 3 again illustrating use of the test focus monitor of FIG. 2.

Generally, prior to actual fabrication of semiconductor devices, a test focus monitor in the form of for example a reticle is used as part of the overall system to achieve proper focus of the image on the wafer. An example of such a monitor is shown and described in the paper entitled "New Phase Shift Ratings For Measuring Aberrations", by Hiroshi Nomura, published by SPIE, dated Feb. 27, 2001, which is herein incorporated by reference. FIGS. 2–4 herein show a monitor 50 configured as shown in FIGS. 3 and 5 of that paper. The monitor 50 is made up of a quartz base 52 which is transparent to light, and which has a plurality of parallel, opaque, spaced apart lines 54 on the base 52, the lines 54 having a first set of adjacent ends 55, and a second, opposite set of adjacent ends 56. The area between each adjacent pair of lines 54 is transparent to light and is made up of regions 58 which pass light therethrough without changing the phase thereof, and regions 60 which pass light therethrough which shift the phase of such light by 90° (the phase shifting caused by recesses 62 in the base 52—see FIGS. 3 and 4 and the above cited paper). Each of the lines 54 has a region 58 and a region 60 which are aligned along and on one side thereof, and a region 58 and a region 60 which are aligned along and on the opposite side thereof. Each of the lines 54 has a region 58 on one side thereof opposite a region 60 on the other side thereof, these regions 58, 60 running from end 55 of that line to adjacent to the middle thereof, and furthermore, each of the lines 54 has a region 60 on the one side thereof opposite a region 58 on the other side thereof, these regions 60, 58 running from end 56 to adjacent the middle thereof.

FIGS. 3 and 4 are views similar to that shown in FIG. 1, but incorporating the monitor 50 of FIG. 2 as a part of the system 30. FIG. 3 includes a sectional view of the monitor 50 taken along the line 3—3 of FIG. 2, showing a cross-section of the upper area 50A of the monitor 50, while FIG. 4 includes a sectional view of the monitor 50 taken along the line 4—4 of FIG. 2, showing a cross-section of the lower area 50B of the monitor 50. As will be seen, with reference to the upper area 50A of the monitor 50 FIG. 3), moving the wafer 34 and lens 44 relatively together and apart causes the shadows 64A, 64B, 64C formed on the photoresist 32 of the wafer 34 (formed by the opaque lines 54) to shift (downward as the wafer 34 and lens 44 are moved relatively further apart). Mile, with reference to the lower area 50B of the monitor 50 (FIG. 4), moving the wafer 34 and lens 44 relatively together and apart causes the shadows 64D, 64E, 64F formed on the photoresist 32 of the wafer 34 to sit (upward as the wafer 34 and lens 44 are moved relatively further apart). The doted lines 66 in FIGS. 3 and 4 indicate the traverse of the shadows 64A, 64B, 64C, 64D, 64E, 64F as the wafer 34 is so moved relatively toward and away from the lens 44.

Figure 5:
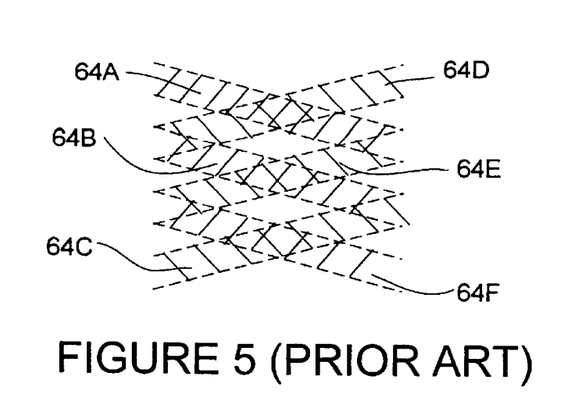
FIG. 5 is a plan view showing the paths of the shadows falling on the wafer as the optical system of FIGS. 3 and 4 is used.

These paths are plotted m FIG. 5, and the intersections thereof indicate the best focus of the image on the wafer 34.

Figure 6:
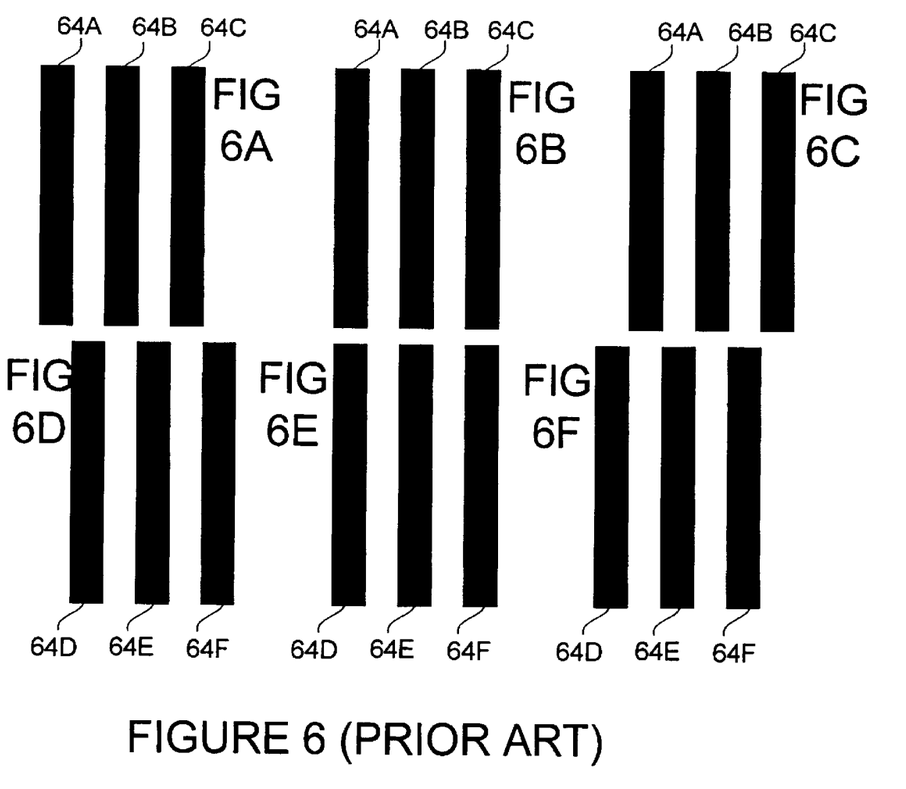
FIG. 6 includes FIGS. 6A–6F further illustrating use of the system of FIGS. 3 and 4.

FIG. 6 includes FIGS. 6A–6F which are views taken along the lines 6A—6A, 6B—6B, 6C—6C, 6D—6D, 6E—6E, and 6F—6F of FIGS. 3 and 4. With the wafer 34 and lens 44 closest together as shown in FIGS. 3 and 4, FIGS. 6A and 6D show the simultaneous positions of the shadows 64A–64F on the photoresist 32 determined by the respective areas 50A, 50B of the monitor 50. With the wafer 34 and lens 44 so positioned relative to each other, the photoresist 32 is exposed to light from the light source 36 and is then developed to determine photoresist lines which corresponds to the positions of the shadows 64A–64F. As will be seen, the lines of FIGS. 6A and 6D are misaligned As the wafer 34 and lens 36 are moved relatively further apart to an intermediate position as shown in FIGS. 3 in 4, FIGS. 6B and 6E show the simultaneous positions of the shadows 64A–64F on the photoresist 32 determined by the respective areas 50A, 50B of the monitor 50. Again, the photoresist 32 is exposed to light from the light source 36 and is then developed to determine photoresist lines which correspond to the positions of the shadows 64A–64F. As will be seen, the lines of FIGS. 6B and 6E are substantially in alignment. Then, as the wafer 34 and lens 44 are moved relatively further apart, i.e., to their most far apart positions as shown in FIGS. 3 and 4, FIGS. 6C and 6F show the simultaneous positions of the shadows 64A–64F on the photoresist 32 determined by their respective areas 50A, 50B of the monitor 50. Again with the wafer 34 and lens 44 so positioned relative to each other, the photoresist 32 is exposed to a light from the light source 36 and is then developed to determine photoresist lines which correspond to the positions of the shadows 64A–64F. As will be seen, the lines of FIGS. 6E and 6F are misaligned.

It will be seen that changing the distance between the lens 44 and wafer 34 causes the shadows 64A–64C to move further in and out of alignment with the shadows 64D–64F. The process of moving the lens 44 and wafer 34 Lively closer together and further apart, along with the corresponding exposure and development of the photoresist 32 accompanying each adjustment, is repeated until the lines formed in the photoresist 32 are substantially straight. This is illustrated in FIG. 6 of the above cited paper.

While such an approach is useful, only a relatively coarse reading of focus is achievable. For example, with reference to FIG. 6 of the above cited paper, only a small shift in the pattern from top to bottom is shown over a range of 400 nm of rive movement between the wafer 34 and lens 44. With device dimensions continually being reduced, there is a need to achieve a proper reading of focus within a much smaller range of lens-wafer relative movement, for example, 200 nm or less.

The Benchmark Technologies Incorporated Phase Shift Focus Monitor Test Reticle 100 (FIG. 7) uses phase shifting to produce images which shift according to the magnitude of defocus. In this apparatus 100, a quartz body 102 which is transparent to light has thereon opaque, for example chrome, lines 104, 106, 108, 110 which define an outline 112 in the shape of a square. The body 102 also has thereon opaque, for example chrome, lines 114, 116, 118, 120 that define an outline 122 in the shape of a square, which is centrally positioned relative to and within the square 112. The regions 124 of the quartz body 102 allow light to be transmitted therethrough without changing the phase thereof, while the regions 126, recessed as described above, allow light to be transmitted therethrough while changing the phase thereof by 90°. It will be seen that with this configuration, each opaque line is positioned between phase shifted and unshifted regions of the body.

Figure 7:
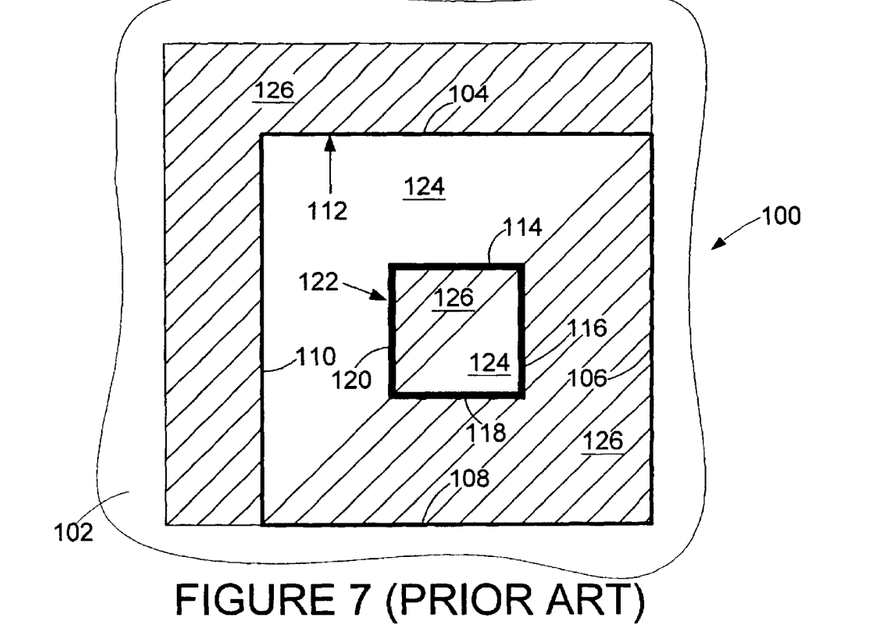
FIG. 7 is a plan view of another test focus monitor based an the prior art.
Figures 8A, 8B:
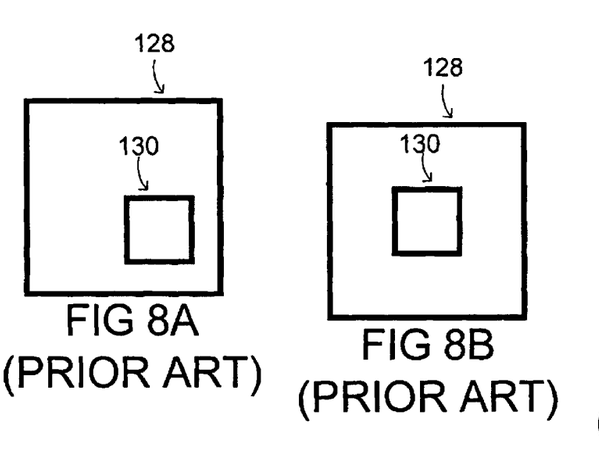
FIG. 8 includes FIGS. 8A–8C illustrating use of the test focus monitor of FIG. 7.
Figure 8C:
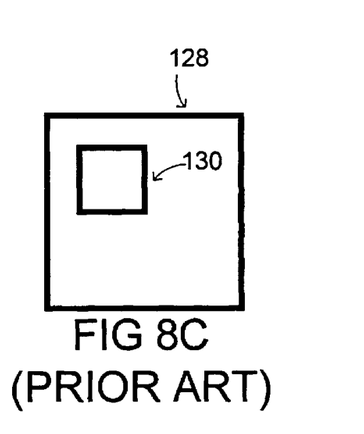

With the reticle 100 of FIG. 7 used in the apparatus of FIG. 1, variation in the distance between the lens 44 and the wafer 34 causes the images 128, 130 of the square 112 and the square 122 to shift relative to each other as shown in FIGS. 8A, 8B and 8C. That is, with the distance between the lens 44 and wafer 34 providing proper focus, the images 128, 130 formed by the square 112 and the square 122 correspond to the positioning of the outlines 112, 122 on the reticle 100 forming these images, i.e., the image 130 of the square on the wafer 34 is centrally located within the image of the square 128 on the wafer 34 (FIG. 8B). Decreasing the distance between the lens 44 and the wafer 34 causes the image 128 formed by the outline 112 to shift leftward and upward while the image 130 formed by the outline 122 shifts rightward and downward (FIG. 8A), indicating defocus. Increasing the distance between the lens 44 and wafer 34 causes the image 128 formed by the outline 112 to shift rightward and downwardly while the image 130 formed by the outline 122 shifts leftward and upward until the image 130 is centrally located within the image 128 (see FIG. 8B), indicating that the image is in focus on the wafer 34. Further movement of the lens 44 and wafer 34 apart causes the image 128 formed by the outline 112 to further move downward and rightward, while the image 130 formed by the outline 122 further moves upward and leftward (FIG. 8C), indicating defocus.

Similar to the above-described system, only a relatively coarse reading of focus is achievable. For example, the shift in positions of the images when going from FIG. 8A to FIG. SC occurs over a range of 800 nm relative movement between the wafer 34 and lens 44. With device dimensions continually being reduced, there is a need to achieve a proper reading of focus within a much smaller range of lens-wafer relative movement, for example 200 nm or less.

SUMMARY OF THE INVENTION

The present invention is an optical tool including a tool body that is transparent to light. Pluralities of opaque, parallel lines on the body form a first outline in the shape of square. Additional pluralities of opaque, parallel lines on the body form an outline in the shape of the square that is centrally located relative to and within the first-mentioned square. Each pair of adjacent lines has therebetween a first region which allows transmission of light therethrough without changing phase thereof and a second region alongside the first region which allows transmission of light therethrough while shifting the phase thereof by 90°. The regions are laid out so that the images of the outlines formed by a lens on an object shift a subs amount upon relative movement between the lens and object.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made m detail to specific embodiment of the present invention which illustrates the best mode presently contemplated by the inventors for practicing the invention.

Figure 9:
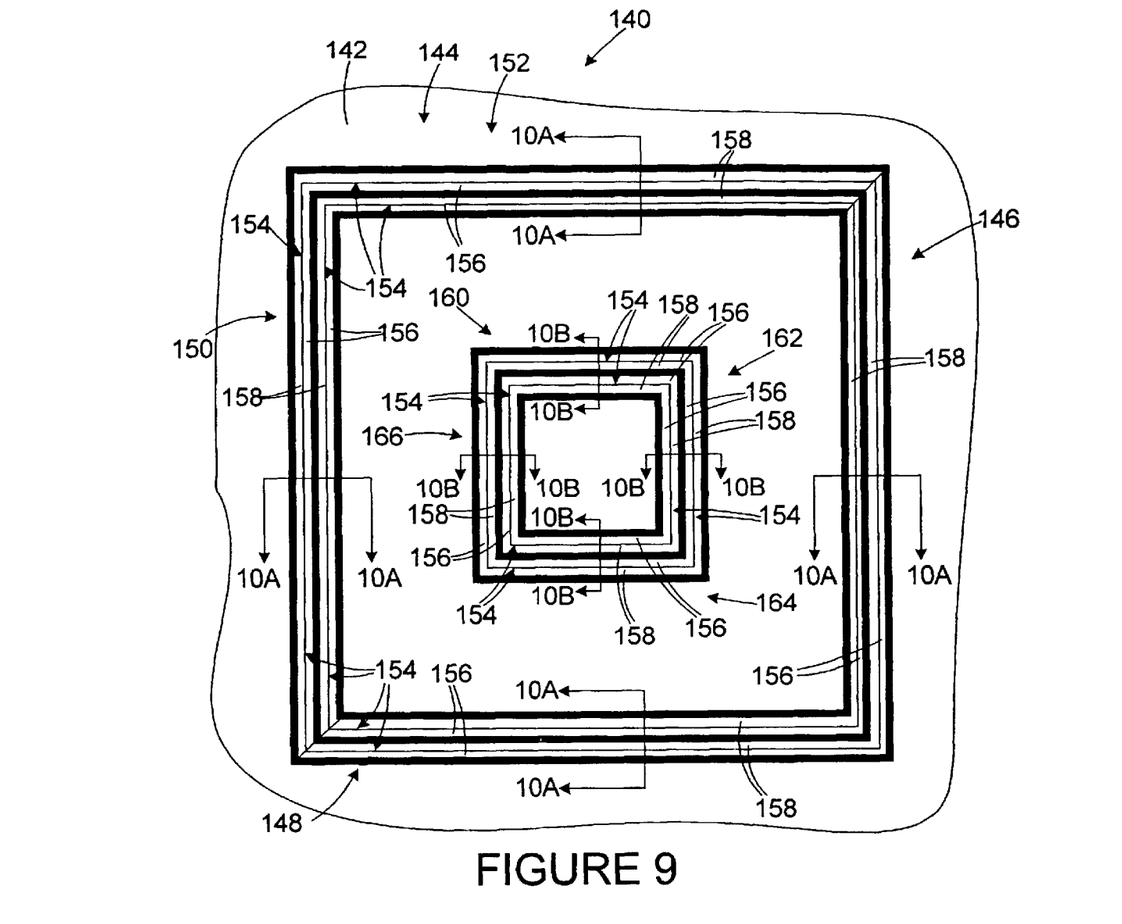
FIG. 9 is a plan view of the present inventive test focused monitor.

FIG. 9 and sectional views FIGS. 10A and 10B show the present test reticle 140 which is the subject of this invention. The present test reticle 140 includes a quartz body 142 that is transparent to light. The quartz body 142 has first, second, third and fourth sets of pluralities of parallel, opaque, for example, chrome lines 144, 146, 148, 150 on the body 142 which form an outline 152 in the configuration of a square. Between each adjacent pair of lines 144, 146,148, 150 is a transparent portion 154 which includes first and second regions 156, 158 in side-by-side relation running the length of the adjacent lines, in each case with the first region separating one of the adjacent pair of parallel lines from the second region, and the second region separating the first region from the other of the adjacent pair of parallel lines, the region 156 providing transmission of light therethrough without change in phase thereof, the region 158, being recessed as described above, providing transmission of light therethrough while changing the phase thereof by 90°.

The quartz body also has fifth, sixth, seventh and eighth sets of pluralities of parallel, opaque, for example, chrome lines 160, 162, 164, 166 on the body 142 which form an outline 168 in the configuration of square, which is centrally positioned within the first-mentioned outline 152. Between each adjacent pair of lines 160, 162, 164, 166 is a transparent portion 154 which includes first and second regions 156, 158 in side-by-side relation running the length of the adjacent lines, in each case with the first region separating one of the adjacent pair of parallel lines from the second region, and the second region separating the first region from the other of the adjacent pair of parallel lines, the region 156 providing transmission of light therethrough without change in phase thereof, the region 158, being recessed as described above, providing transmission of light therethrough which changes the phase thereof by 90°.

The lines of the first, third fifth and seventh sets 144, 148, 160, 164 thereof are parallel to each other, while the lines of the second, fourth, sixth and eighth sets 146, 150, 162, 166 thereof are parallel to each other.

The present rectile 140 contains no regions which are the equivalent of the phase shifting regions 172 of the reticle of FIG. 7.

Figure 10:
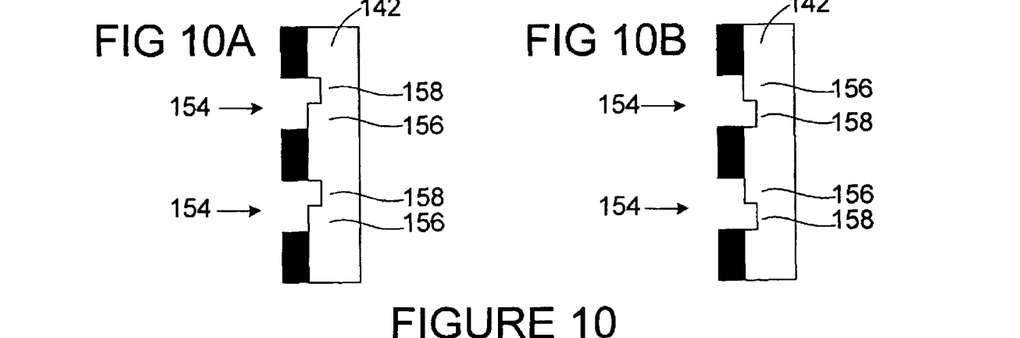
FIG. 10 includes FIGS. 10A and 10B which are sectional views taking along any of the lines 10A—10A and 10B—10B of FIG. 9.

The positions of the first and second regions 156, 158 between the adjacent lines of the first set 144 thereof correspond to the positions of the first and second regions 156, 158 between the adjacent lines of the third set 148 thereof (see sectional view 10A—10A, FIG. 10). Similarly, the positions of the first and second regions 156, 158 between the adjacent line of the second set 146 thereof correspond to the positions of the first and second regions 156, 158 between the adjacent lines of the fourth set 150 thereof (see sectional view 10A–10A, FIG. 10). The positions of the first and second regions 156, 158 between the adjacent lines of the fifth set 160 thereof correspond to the positions of the first and second regions 156, 158 between adjacent lines of the seventh set 164 thereof, and the positions of the first and second regions 156, 158 between adjacent lines of the sixth set 162 thereof correspond to the positions of the first and second regions 156, 158 between adjacent lines of the eighth set 166 thereof (see sectional view 10B—10B, FIG. 10).

The positions of the first and second regions 156, 158 between adjacent lines of the first set of lines 144 are reversed relative to the positions of the first and second regions 156, 158 between adjacent lines of the fifth set of lines 160, and the positions of the first and second regions 156, 158 between adjacent lines of the second set of lines 146 are reversed relative to the positions of the first and second regions 156, 158 between adjacent lines of the sixth set of lines 162.

Figure 11A:
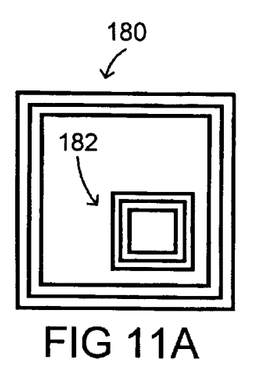
FIG. 11 inches FIGS. 11A–11C which illustrate the use of the test focus monitor of FIG. 9.
Figure 11B:
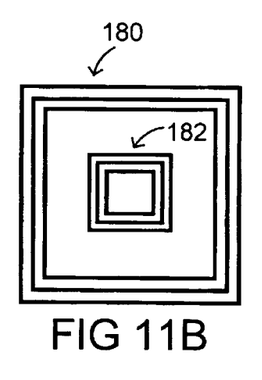
Figure 11C:
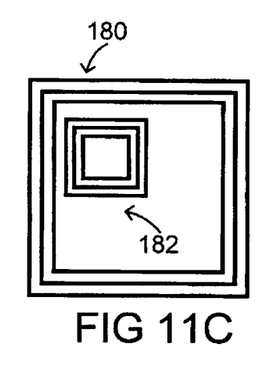

With the reticle 140 of FIG. 9 used in the apparatus of FIG. 1, variation in the distance between the lens 44 and the wafer 34 causes the images 180, 182 of the square 152 and the square 168 to shift relative to each other as shown in FIGS. 11A, 11B and 11C. That is, with the distance between the wafer 34 and the lens 44 providing proper focus, the images 180, 182 formed by the square 152 and the square 168 correspond to the positioning of the outlines 152, 168 on the reticle 140 forming those images, i.e., the image 182 of the square 168 on the wafer 34 is centrally located within the image 180 of the square 152 on the wafer 34 (FIG. 11B).

Decreasing the distance the lens 44 and the wafer 34 causes the image 180 formed by the outline 152 to shift leftward and upward while the image 182 formed by the outline 168 shifts rightward and downward (FIG. 11A), indicating defocus, all as described above. Increasing the distance between the lens 44 and wafer 34 causes the image 180 formed by the outline 152 to shift rightward and downward while the image 182 formed by the outline 168 shifts leftward and upward until the image 182 of the square 168 is centrally located within the image 180 of the square 152 (see FIG. 1B, wherein the image is properly focused on the wafer 34). Further movement of the lens 44 and wafer 34 apart causes the image 180 formed by the outline 152 to further move downward and rightward, while the image 182 formed by the outline 168 further moves upward and leftward, indicating defocus.

However, the present apparatus is much more sensitive to changing distance between the lens 44 and the wafer 34 then is the previously described system That is, the relative changing of the positions of the images 180, 182 when going from the state showing FIG. 11A to the state shown in FIG. 11C is obtained through approximately 200 nm of relative movement between the lens 44 and wafer 34. This is to be compared with the patterns of shift of FIG. 8, which appear to be similar to those shown in the present FIGS. 11A–11 C, but are obtained over a range of approximately 500 nm of relative movement between the wafer 34 and lens 44. The increased sensitivity of the present embodiment is achieved by use of the multiple opaque lines as described above, each adjacent pair having therebetween a region which passes light therethrough without changing phase thereof, and a region which passes light therethrough while changing the phase thereof by 90°, all laid out as described above.

Figure 12A:
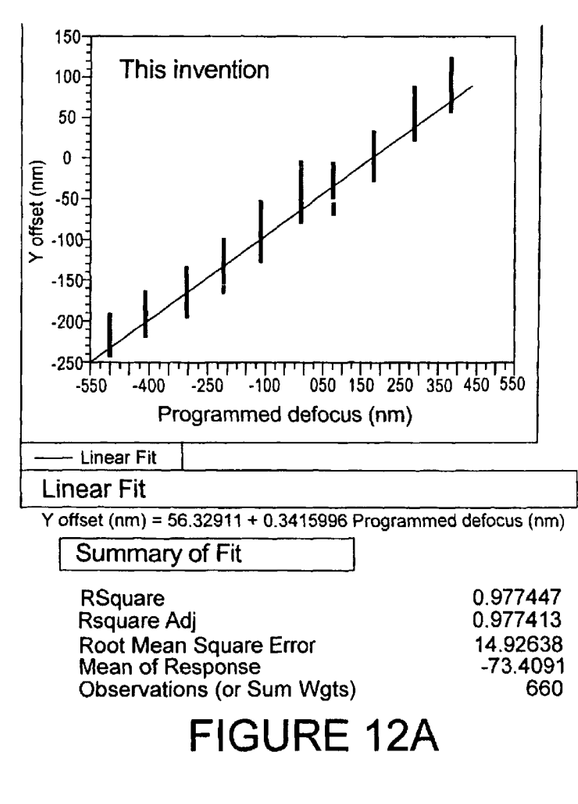
FIG. 12 includes FIG. 12A and 12B, which are graphical representations showing the improvement in sensitivity of the present apparatus, as compared to the prior art.
Figure 12B:
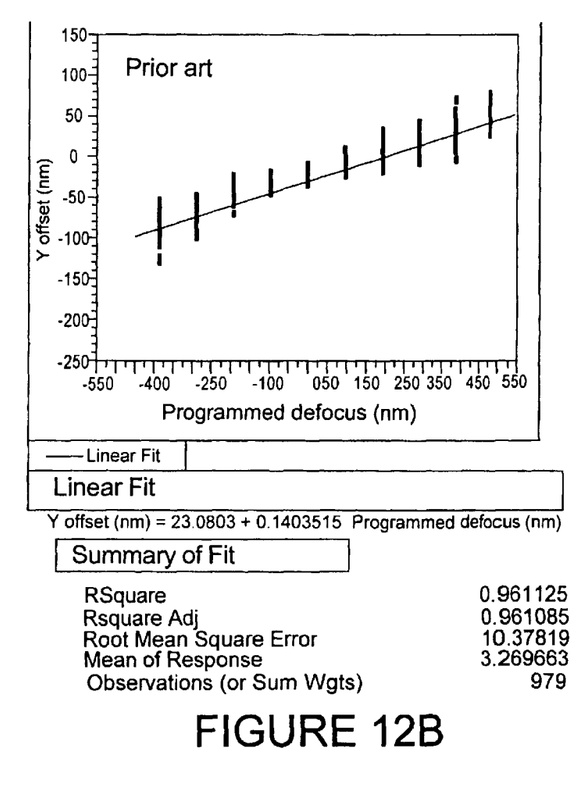

The improvement in sensitivity is clearly illustrated in the graphs shown on FIGS. 12A and 12B. As will be seen, the change in defocus is much greater for a given change in distance between the lens 44 and wafer 34 that in the prior art. It will thus be seen that a test reticle 140 that is greatly improved in sensitivity is herein provided.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the invention in use contemplated. All such modifications and variations are within the scope of the invention as determined by the appended claims when interpreted in accordance with the breadth to which they are fairly, legally and equitably entitled.

What is claimed is:

1. An optical tool comprising:
   a tool body which is transparent to light;
   a first plurality of sets of opaque, substantially parallel lines on the body, forming a first outline;
   a second plurality of sets of opaque, substantially parallel lines on the body, forming a second outline;
   relative movement between images formed by the first and second outlines on an object being provided upon relative movement between the object and a lens through which images are formed upon the object;
   further comprising first and second regions of the tool body in side-by-side relation between an adjacent pair of parallel lines, the first region separating one of the adjacent pair of parallel lines from the second region, the second region separating the first region from the other of the adjacent pair of parallel lines, the first region providing transmission of light therethrough at a first phase, the second region providing transmission of light therethrough at a second phase different from the first phase.

2. The optical tool of claim 1 wherein the adjacent pair of lines is part of the first plurality of sets of lines.

3. The optical tool of claim 1 wherein the adjacent pair of lines is part of the second plurality of sets of lines.

4. The optical tool of claim 2 and further comprising first and second regions of the tool body in side-by-side relation between an additional adjacent pair of lines, the first regions providing transmission on of light therethrough at the first phase, the second regions being providing transmission of light therethrough at the second phase.

5. The optical tool of claim 4 wherein the second outline is positioned within the first outline.

6. An optical tool comprising:
a tool body which is transparent to light;
first, so third and fourth sets of pluralities of opaque lines on the body forming a first outline;
fifth, sixth seventh and eighth sets of pluralities of opaque lines on the body forming a second outline;
the lines of each set being substantially parallel;
relative movement between ages formed by the first and second outlines on an object being provided upon relative movement between the object and a lens through which images are formed on the object;
further comprising first and second regions of the tool body in side-by-side relation between each adjacent pair of lines, the first region providing transmission of light therethrough at a first phase, the second region providing transmission of light therethrough at a second phase different from the first phase.

7. The optical tool of claim 6 wherein the first and third sets of pluralities of lines are substantially parallel and the second and fourth sets of pluralities of lines are substantially parallel, the fifth and several sets of pluralities of lines are substantially parallel, and the sixth and eighth sets of pluralities of lines are substantially parallel.

8. The optical tool claim 7 wherein the first, third, fifth and seventh sets of pluralities of lines are substantially parallel, and the second, fourth, sixth and eighth pluralities of lines are substantially parallel.

9. The optical tool of claim 8 wherein the positions of the first and second regions between each adjacent pair of lines of the first set thereof correspond to the positions of the first and second regions between each adjacent pair of lines of the third set thereof, and wherein the positions of the first and second regions between each adjacent pair of lines of the second set thereof correspond to the positions of the first and second regions between each adjacent pair of lines of the fourth set thereof.

10. The optical tool of claim 9 wherein the positions of the first and second regions between adjacent pairs of lines of the fifth set thereof correspond to the positions of the first and second regions between each adjacent pair of lines of the seventh set thereof, and wherein the positions of the first and second regions between each adjacent pair of lines of the sixth set thereof correspond to the positions of the first and second regions between each adjacent pair of lines of the eighth set thereof.

11. The optical tool of claim 8 wherein the positions of the first and second regions between adjacent pairs of lines of the fifth set thereof correspond to the positions of the first and second regions b e each adjacent pair of lines of the seventh set thereof, and wherein the positions of the first and second regions between each adjacent pair of lines of the sixth set thereof correspond to the positions of the first and second regions between each adjacent pair of lines of the seventh set thereof.

12. The optical tool of claim 10 wherein the second outline is positioned within the first outline.

13. The optical tool of claim 10 wherein the positions of the first and second regions between adjacent pairs of lines of the first set thereof are correspondingly opposite to the positions of the first and second regions between adjacent pairs of lines of the fifth set thereof, the positions of the first and second regions between the adjacent pairs of lines of the second set thereof are correspondingly opposite to the positions of the first and second regions between adjacent pairs of lines of the sixth set thereof, the positions of the first and second regions between adjacent pairs of lines of the third set thereof are correspondingly opposite to the positions of the first and second regions between adjacent pairs of lines of the seventh set thereof, and the positions of the first and second regions between adjacent pairs of lines of the fourth set thereof are correspondingly opposite to the positions of the first and second regions between adjacent pairs of lines of the eighth set thereof.

14. The optical tool of claim 13 wherein the first outline is substantially square in configuration.

15. The optical tool of claim 14 wherein the second outline is substantially square in configuration, and is positioned within the first outline.

* * * * *

UNITED STATES PATENT AND TRADEMARK OFFICE
CERTIFICATE OF CORRECTION

PATENT NO. : 6,710,853 B1
DATED : March 23, 2004
INVENTOR(S) : Bruno La Fontaine, Jongwook Kye and Harry Levinson It is certified that error appears in the above-identified patent and that said Letters Patent is hereby corrected as shown below:

<u>Title page,</u>
Item [57], ABSTRACT,
Line 12, "shit" should read -- shift --;

<u>Column 1,</u>
Line 22, "so that fall" should read -- so that images that fall --;
Line 63, "FIG.3)" should read -- (FIG.3) --;

<u>Column 2,</u>
Line 1, "Mile" should read -- Meanwhile --;
Line 4, "sit" should read -- shift --;
Line 23, "misaligned" should read -- misaligned. --;
Line 47, "Lively" should read -- relatively --;
Line 58, "rive" should read -- relatively --;

<u>Column 3,</u>
Line 42, "SC" should read -- 8C --;
Line 62, "subs" should read -- substantial --;

<u>Column 4,</u>
Line 34, "an" should read -- on --;
Line 42, "inches" should read -- includes --;
Line 50, "m" should read -- in --;

<u>Column 5,</u>
Line 26, "rectile" should read -- reticle --;
Line 27, "172" should read -- 126 --;

<u>Column 6,</u>
Line 1, "distance the" should read -- distance between the --;

UNITED STATES PATENT AND TRADEMARK OFFICE
CERTIFICATE OF CORRECTION

PATENT NO. : 6,710,853 B1
DATED : March 23, 2004
INVENTOR(S) : Bruno La Fontaine, Jongwook Kye and Harry Levinson

It is certified that error appears in the above-identified patent and that said Letters Patent is hereby corrected as shown below:

Column 7,
Line 16, "transmission on of" should read -- transmission of --;
Line 24, "so" should read -- second, --;
Line 29, "ages" should read -- images --;
Line 42, "several" should read -- seventh --;

Column 8,
Line 19, "b e" should read -- between --.

Signed and Sealed this

Second Day of November, 2004

JON W. DUDAS
*Director of the United States Patent and Trademark Office*